(12) United States Patent
Nishimoto et al.

(10) Patent No.: US 7,147,749 B2
(45) Date of Patent: *Dec. 12, 2006

(54) METHOD AND APPARATUS FOR AN IMPROVED UPPER ELECTRODE PLATE WITH DEPOSITION SHIELD IN A PLASMA PROCESSING SYSTEM

(75) Inventors: Shinya Nishimoto, Nirasaki (JP); Kouji Mitsuhashi, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 76 days.

This patent is subject to a terminal disclaimer.

(21) Appl. No.: 10/259,858

(22) Filed: Sep. 30, 2002

(65) Prior Publication Data

US 2004/0060661 A1 Apr. 1, 2004

(51) Int. Cl.
*C23C 16/00* (2006.01)
*H01L 21/00* (2006.01)

(52) U.S. Cl. .................. 156/345.43; 118/723 E; 118/723 R; 156/916

(58) Field of Classification Search ............. 118/723 E, 118/723 R; 156/345.43, 345.44, 345.45, 156/345.46, 345.47
See application file for complete search history.

(56) References Cited

U.S. PATENT DOCUMENTS

| | | |
|---|---|---|
| 4,310,390 A | 1/1982 | Bradley et al. |
| 4,357,387 A | 11/1982 | George et al. ............... 442/71 |
| 4,469,619 A | 9/1984 | Ohno et al. |
| 4,593,007 A | 6/1986 | Novinski |
| 4,612,077 A | 9/1986 | Tracy et al. |
| 4,842,683 A | 6/1989 | Cheng et al. |
| 4,877,757 A | 10/1989 | York et al. |
| 5,000,113 A * | 3/1991 | Wang et al. ............. 118/723 E |
| 5,074,456 A | 12/1991 | Degner et al. |
| 5,334,462 A * | 8/1994 | Vine et al. ................. 428/697 |
| 5,362,335 A * | 11/1994 | Rungta ....................... 148/272 |
| 5,366,585 A * | 11/1994 | Robertson et al. ............ 216/67 |
| 5,423,936 A | 6/1995 | Tomita et al. |
| 5,426,310 A | 6/1995 | Tamada et al. |
| 5,484,752 A | 1/1996 | Waku et al. |
| 5,494,713 A * | 2/1996 | Ootuki ....................... 427/579 |
| 5,521,790 A | 5/1996 | Ruckel et al. ............... 361/234 |
| 5,551,190 A | 9/1996 | Yamagishi et al. |
| 5,556,501 A | 9/1996 | Collins et al. |
| 5,614,055 A | 3/1997 | Fairbairn et al. |
| 5,637,237 A | 6/1997 | Oehrlein et al. |
| 5,641,375 A | 6/1997 | Nitescu et al. |
| 5,680,013 A * | 10/1997 | Dornfest et al. ......... 315/111.21 |

(Continued)

FOREIGN PATENT DOCUMENTS

DE 94 21 671 7/1996

(Continued)

OTHER PUBLICATIONS

Patent Abstracts of Japan, JP 2002-151473, May 24, 2002.

(Continued)

*Primary Examiner*—Parviz Hassanzadeh
*Assistant Examiner*—Michelle Crowell
(74) *Attorney, Agent, or Firm*—Oblon, Spivak, McClelland, Maier & Neustadt, P.C.

(57) ABSTRACT

The present invention presents an improved upper electrode for a plasma processing system, wherein the design and fabrication of an electrode plate with a deposition shield coupled to the upper electrode advantageously provides gas injection of a process gas with substantially minimal erosion of the upper electrode while providing protection to a chamber interior.

78 Claims, 12 Drawing Sheets

U.S. PATENT DOCUMENTS

| | | | |
|---|---|---|---|
| 5,725,960 A | 3/1998 | Konishi et al. | |
| 5,759,360 A | 6/1998 | Ngan et al. | |
| 5,798,016 A | 8/1998 | Oehrlein et al. | |
| 5,834,070 A | 11/1998 | Movchan et al. | |
| 5,851,343 A | 12/1998 | Hsu | |
| 5,868,848 A | 2/1999 | Tsukamoto | |
| 5,879,575 A | 3/1999 | Tepman et al. | |
| 5,885,356 A | 3/1999 | Zhao et al. | |
| 5,885,402 A | 3/1999 | Esquibel | 156/345.24 |
| 5,891,253 A | 4/1999 | Wong et al. | |
| 5,892,278 A | 4/1999 | Horita et al. | 257/706 |
| 5,894,887 A | 4/1999 | Kelsey et al. | |
| 5,895,586 A | 4/1999 | Kaji et al. | |
| 5,900,064 A | 5/1999 | Kholodenko | |
| 5,902,763 A | 5/1999 | Waku et al. | |
| 5,911,852 A | 6/1999 | Katayama et al. | |
| 5,919,332 A | 7/1999 | Koshiishi et al. | |
| 5,925,228 A | 7/1999 | Panitz et al. | 204/484 |
| 5,944,902 A | 8/1999 | Redeker et al. | |
| 5,948,521 A | 9/1999 | Dlugosch et al. | |
| 5,952,054 A | 9/1999 | Sato et al. | |
| 5,952,060 A * | 9/1999 | Ravi | 427/577 |
| 5,955,182 A | 9/1999 | Yasuda et al. | |
| 5,968,377 A | 10/1999 | Yuasa et al. | |
| 5,985,102 A | 11/1999 | Leiphart | |
| 5,994,662 A | 11/1999 | Murugesh | |
| 6,068,729 A | 5/2000 | Shrotriya | 156/345.26 |
| 6,073,449 A | 6/2000 | Watanabe et al. | 62/3.2 |
| 6,096,161 A * | 8/2000 | Kim et al. | 156/345.47 |
| 6,106,625 A | 8/2000 | Koai et al. | |
| 6,110,287 A | 8/2000 | Arai et al. | |
| 6,120,640 A | 9/2000 | Shih et al. | |
| 6,120,955 A | 9/2000 | Tokutake et al. | |
| 6,123,791 A * | 9/2000 | Han et al. | 156/1 |
| 6,123,804 A | 9/2000 | Babassi et al. | |
| 6,129,808 A | 10/2000 | Wicker et al. | |
| 6,139,983 A | 10/2000 | Ohashi et al. | |
| 6,143,646 A | 11/2000 | Wetzel | |
| 6,170,429 B1 * | 1/2001 | Schoepp et al. | 118/723 R |
| 6,176,969 B1 | 1/2001 | Park et al. | |
| 6,182,603 B1 | 2/2001 | Shang et al. | |
| 6,210,486 B1 | 4/2001 | Mizukami et al. | |
| 6,221,202 B1 | 4/2001 | Walko, II | |
| 6,246,479 B1 | 6/2001 | Jung et al. | |
| 6,264,788 B1 | 7/2001 | Tomoyasu et al. | |
| 6,265,757 B1 | 7/2001 | Brady et al. | |
| 6,266,133 B1 | 7/2001 | Miyajima et al. | |
| 6,296,740 B1 | 10/2001 | Xie et al. | |
| 6,335,293 B1 | 1/2002 | Luo et al. | |
| 6,364,949 B1 | 4/2002 | Or et al. | |
| 6,368,987 B1 | 4/2002 | Kopacz et al. | |
| 6,373,573 B1 | 4/2002 | Jung et al. | |
| 6,383,333 B1 | 5/2002 | Haino et al. | |
| 6,383,964 B1 * | 5/2002 | Nakahara et al. | 501/152 |
| 6,394,026 B1 | 5/2002 | Wicker et al. | |
| 6,444,083 B1 | 9/2002 | Steger et al. | |
| 6,514,377 B1 | 2/2003 | Morimoto | |
| 6,519,037 B1 | 2/2003 | Jung et al. | |
| 6,527,911 B1 | 3/2003 | Yen et al. | |
| 6,533,910 B1 | 3/2003 | O'Donnell et al. | |
| 6,537,429 B1 | 3/2003 | O'Donnell et al. | |
| 6,544,380 B1 | 4/2003 | Tomoyasu et al. | |
| 6,554,906 B1 | 4/2003 | Kuibira et al. | |
| 6,562,186 B1 | 5/2003 | Saito et al. | 156/345.24 |
| 6,570,654 B1 | 5/2003 | Jung et al. | |
| 6,583,064 B1 | 6/2003 | Wicker et al. | |
| 6,590,660 B1 | 7/2003 | Jung et al. | |
| 6,613,204 B1 | 9/2003 | Xie et al. | |
| 6,613,442 B1 | 9/2003 | O'Donnell et al. | |
| 6,641,697 B1 | 11/2003 | Han et al. | |
| 6,663,714 B1 | 12/2003 | Mizuno et al. | |
| 6,695,929 B1 | 2/2004 | Kaneklyo et al. | |
| 6,726,801 B1 | 4/2004 | Ahn | |
| 6,733,620 B1 | 5/2004 | Sugiyama et al. | |
| 6,738,862 B1 | 5/2004 | Ross et al. | |
| 6,776,873 B1 | 8/2004 | Sun et al. | |
| 6,783,863 B1 | 8/2004 | Harada et al. | |
| 6,783,875 B1 | 8/2004 | Yamada et al. | |
| 6,798,519 B1 | 9/2004 | Nishimoto et al. | |
| 6,805,952 B1 | 10/2004 | Chang et al. | |
| 6,806,949 B1 | 10/2004 | Ludviksson et al. | |
| 6,811,651 B1 | 11/2004 | Long | |
| 6,830,622 B1 * | 12/2004 | O'Donnell et al. | 118/715 |
| 6,833,279 B1 | 12/2004 | Choi | |
| 6,837,966 B1 | 1/2005 | Nishimoto et al. | |
| 6,852,433 B1 | 2/2005 | Maeda | |
| 6,875,477 B1 | 4/2005 | Trickett et al. | |
| 6,884,516 B1 | 4/2005 | Harada et al. | |
| 6,894,769 B1 | 5/2005 | Ludviksson et al. | |
| 2001/0003271 A1 * | 6/2001 | Otsuki | 118/723 I |
| 2001/0050144 A1 | 12/2001 | Nishikawa et al. | |
| 2002/0076508 A1 | 6/2002 | Chiang et al. | |
| 2002/0086118 A1 | 7/2002 | Chang et al. | |
| 2002/0086501 A1 | 7/2002 | O'Donnell et al. | |
| 2002/0086545 A1 | 7/2002 | O'Donnell et al. | |
| 2002/0086553 A1 | 7/2002 | O'Donnell et al. | |
| 2002/0090464 A1 | 7/2002 | Jiang et al. | |
| 2002/0142611 A1 | 10/2002 | O'Donnell et al. | |
| 2002/0177001 A1 | 11/2002 | Harada et al. | 428/469 |
| 2003/0010446 A1 | 1/2003 | Kajiyama et al. | |
| 2003/0025963 A1 | 2/2003 | Kaushal et al. | |
| 2003/0084646 A1 | 5/2003 | Long | |
| 2003/0113479 A1 | 6/2003 | Fakuda et al. | 427/569 |
| 2003/0200929 A1 | 10/2003 | Otsuki | |
| 2004/0026372 A1 | 2/2004 | Takenaka et al. | |
| 2004/0035364 A1 | 2/2004 | Tomoyoshi et al. | |
| 2004/0050495 A1 | 3/2004 | Sumiya et al. | |
| 2004/0060516 A1 | 4/2004 | Nishimoto et al. | |
| 2004/0060656 A1 | 4/2004 | Saigusa et al. | |
| 2004/0060657 A1 | 4/2004 | Saigusa et al. | |
| 2004/0060658 A1 | 4/2004 | Nishimoto et al. | |
| 2004/0060661 A1 | 4/2004 | Nishimoto et al. | |
| 2004/0061447 A1 | 4/2004 | Saigusa et al. | |
| 2004/0063333 A1 | 4/2004 | Saigusa et al. | |
| 2004/0072426 A1 | 4/2004 | Jung | |
| 2004/0081746 A1 | 4/2004 | Imafuku | |
| 2004/0083970 A1 | 5/2004 | Imafuku et al. | |
| 2004/0125359 A1 | 7/2004 | Ludvikisson et al. | |
| 2004/0168640 A1 | 9/2004 | Muto et al. | |
| 2004/0173155 A1 | 9/2004 | Nishimoto et al. | |
| 2004/0216667 A1 | 11/2004 | Mitsuhashi et al. | |
| 2005/0103268 A1 | 5/2005 | Nishimoto et al. | |
| 2005/0103275 A1 | 5/2005 | Sasaki et al. | |
| 2005/0150866 A1 | 7/2005 | O'Donnell | 216/67 |

FOREIGN PATENT DOCUMENTS

| | | |
|---|---|---|
| EP | 0 508 731 | 10/1992 |
| EP | 0 573 057 | 12/1993 |
| EP | 0 814 495 | 6/1997 |
| EP | 0814495 A2 * | 6/1997 |
| EP | 0 799 904 | 10/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2 252 567 | 8/1992 |
| JP | 61-207566 | 9/1986 |
| JP | 64-039728 | 2/1989 |
| JP | 1-312087 | 12/1989 |
| JP | 02-267967 | 11/1990 |
| JP | 03-115535 | 5/1991 |
| JP | 4-238882 | 8/1992 |
| JP | 05-070922 | 3/1993 |

| | | |
|---|---|---|
| JP | 05-117064 | 5/1993 |
| JP | 05-121360 | 5/1993 |
| JP | 05-198532 | 8/1993 |
| JP | 05198532 A * | 8/1993 |
| JP | 05-238859 | 9/1993 |
| JP | 06-057396 | 3/1994 |
| JP | 06-136505 | 5/1994 |
| JP | 06-142822 | 5/1994 |
| JP | 06-256926 | 9/1994 |
| JP | 07-058013 A | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 09-272987 | 10/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10214819 A * | 8/1998 |
| JP | 10-251871 | 9/1998 |
| JP | 11-080925 | 3/1999 |
| JP | 11-207161 | 8/1999 |
| JP | 11-233292 | 8/1999 |
| JP | 11-312646 | 11/1999 |
| JP | 2000-124197 | 4/2000 |
| JP | 2000-303180 | 10/2000 |
| JP | 2001-031484 | 2/2001 |
| JP | 2001-31484 | 2/2001 |
| JP | 2001-152307 | 6/2001 |
| JP | 2001-164354 | 6/2001 |
| JP | 2001-226773 | 8/2001 |
| JP | 2002-151473 | 5/2002 |
| KR | 1998-063542 | 10/1998 |
| KR | 1999-008142 | 1/1999 |
| KR | 2002-0027373 | 4/2002 |
| KR | 10/2004-0007601 | 1/2004 |
| WO | 99/50886 | 10/1999 |
| WO | WO 01/42526 | 6/2001 |
| WO | 02/39495 | 5/2002 |
| WO | 02/48421 | 6/2002 |
| WO | WO 2004/030011 | 4/2004 |
| WO | WO 2004/030012 | 4/2004 |
| WO | WO 2004/030013 | 4/2004 |
| WO | WO 2004/030014 | 4/2004 |
| WO | WO 2004/030015 | 4/2004 |
| WO | WO 2004/030020 | 4/2004 |
| WO | WO 2004/030426 | 4/2004 |
| WO | WO 2004/095530 | 11/2004 |
| WO | WO 2004/095532 | 11/2004 |

OTHER PUBLICATIONS

Production drawing for Deposition Shield, Upper believed to be sold in the U.S. on Apr. 12, 2000.

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Abstract.

Kim, Hee Jee, "Plasma-Sprayed Alumina-Ytiria Ceramic Coatings for Cavitation-Erosion Protection," Sep. 1989, pp. 139-146.

* cited by examiner

METHOD AND APPARATUS FOR AN IMPROVED UPPER ELECTRODE PLATE WITH DEPOSITION SHIELD IN A PLASMA PROCESSING SYSTEM

CROSS-REFERENCE TO RELATED APPLICATIONS

This application is related to co-pending U.S. patent application Ser. No. 10/259,757, entitled "Method and apparatus for an improved upper electrode plate in a plasma processing system", filed on even date herewith; co-pending U.S. patent application Ser. No. 10/259,392, entitled "Method and apparatus for an improved baffle plate in a plasma processing system", filed on even date herewith; co-pending U.S. patent application Ser. No. 10/259,380, entitled "Method and apparatus for an improved baffle plate in a plasma processing system", filed on even date herewith; co-pending U.S. patent application Ser. No. 10/259,353, entitled "Method and apparatus for an improved deposition shield in a plasma processing system", filed on even date herewith; co-pending U.S. patent application Ser. No. 10/259,352, entitled "Method and apparatus for an improved optical window deposition shield in a plasma processing system", filed on even date herewith; and co-pending U.S. patent application Ser. No. 10/259,306, entitled "Method and apparatus for an improved bellows shield in a plasma processing system", filed on even date herewith. The entire contents of all of those applications are herein incorporated by reference in their entirety.

FIELD OF THE INVENTION

The present invention relates to an improved component for a plasma processing system and more particularly to an upper electrode with a deposition shield employed in a plasma processing system to introduce a processing gas and protect a chamber interior.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the processing chamber are exposed to the physically and chemically active plasma and, in time, can erode. The erosion of exposed components in the plasma processing system can lead to a gradual degradation of the plasma processing performance and ultimately to complete failure of the system.

In order to minimize the damage sustained by exposure to the processing plasma, components of the plasma processing system, known to sustain exposure to the processing plasma, are coated with a protective barrier. For example, components fabricated from aluminum can be anodized to produce a surface layer of aluminum oxide, which is more resistant to the plasma. In another example, a consumable or replaceable component, such as one fabricated from silicon, quartz, alumina, carbon, or silicon carbide, can be inserted within the processing chamber to protect the surfaces of more valuable components that would impose greater costs during frequent replacement. Furthermore, it is desirable to select surface materials that minimize the introduction of unwanted contaminants, impurities, etc. to the processing plasma and possibly to the devices formed on the substrate.

In both cases, the inevitable failure of the protective coating, either due to the integrity of the protective barrier or the integrity of the fabrication of the protective barrier, and the consumable nature of the replaceable components demands frequent maintenance of the plasma processing system. This frequent maintenance can produce costs associated with plasma processing down-time and new plasma processing chamber components, which can be excessive.

SUMMARY OF THE INVENTION

The present invention provides an improved upper electrode with a deposition shield for a plasma processing system, wherein the design and fabrication of the upper electrode advantageously addresses the above-identified shortcomings.

It is an object of the present invention to provide the improved upper electrode comprising an electrode plate and a deposition shield. The electrode plate comprises a first surface for coupling the electrode plate to an upper assembly, a second surface, opposite the first surface, comprising a plasma surface configured to face a processing plasma in the plasma processing system and a mating surface for mating with the plasma processing system, and a peripheral edge. The deposition shield comprises a cylindrical wall coupled to the electrode plate and configured to extend therefrom. The cylindrical wall comprises an inner surface contiguous with the plasma surface of the electrode plate, an outer surface contiguous with the mating surface of the electrode plate, and a distal end surface, wherein the distal end surface can comprise a distal end lip surface.

The electrode plate can further include a plurality of gas injection orifices, wherein at least one gas injection orifice comprises an entrant region for receiving a processing gas and an exit region for coupling the processing gas to the plasma processing system, the exit region comprising an injection surface.

The electrode plate can further include a plurality of fastening receptors for receiving fastening devices in order to attach the electrode plate with the deposition shield to the upper electrode.

The electrode plate can further include one or more fastening through-holes for receiving fastening devices in order to attach the electrode plate with the deposition shield to the plasma processing system.

The electrode plate can further include a plenum cavity coupled to the first surface, configured to receive the processing gas, and configured to distribute the processing gas to the plurality of gas injection orifices.

The electrode plate can further include a first sealing feature coupled to the first surface of the electrode plate and configured to seal the electrode plate with the upper assembly, a second sealing feature coupled to the first surface of the electrode plate and configured to seal the electrode plate with the upper assembly, and one or more third sealing features coupled to the first surface of the electrode plate and configured to seal the one or more fastening through-holes with the upper assembly.

The electrode plate can further comprise a diagnostics port, and a fourth sealing feature coupled to the first surface of the electrode plate and configured to seal the diagnostics port with the upper electrode. The diagnostics port can include an entrant cavity and an exit through-hole comprising an interior surface.

It is another object of the present invention to further provide an electrode plate with a deposition shield comprising an opening in the deposition shield for enabling access to the process space through the deposition shield. The opening can comprise a first opening surface, a second opening surface, and a mating surface, wherein the mating surface can comprise one or more tapped holes comprising a fastening surface.

The electrode plate can further comprise a protective barrier formed on a plurality of exposed surfaces of the electrode plate with the deposition shield facing the processing plasma.

It is a further object of the present invention that the exposed surfaces of the electrode plate with the deposition shield comprise the plasma surface of the second surface of the electrode plate, the inner surface of the cylindrical wall of the deposition shield, and the distal end lip surface of the distal end surface of the deposition shield. Additionally, the exposed surfaces can comprise the injection surface of the exit region in the plurality of gas injection orifices, the interior surface of the exit through-hole in the diagnostics port, the first opening surface of the opening, and the mating surface excluding the fastening surface of the opening in the deposition shield.

The present invention provides a method of producing the electrode plate with the deposition shield for the upper electrode in the plasma processing system comprising the steps: fabricating the electrode plate with the deposition shield; anodizing the electrode plate with the deposition shield to form a surface anodization layer on the electrode plate with the deposition shield; machining exposed surfaces on the electrode plate with the deposition shield to remove the surface anodization layer; and forming a protective barrier on the exposed surfaces. The present invention may also optionally include machining the first surface of the electrode plate excluding the plenum cavity, the first sealing feature, the second sealing feature, the one or more third sealing features, the fourth sealing feature, and the distal end mating surface.

The present invention provides another method of producing the electrode plate with the deposition shield for the upper electrode in the plasma processing system comprising the steps: fabricating the electrode plate with the deposition shield; masking the exposed surfaces on the electrode plate with the deposition shield to prevent formation of a surface anodization layer; anodizing the electrode plate with the deposition shield to form the surface anodization layer on the electrode plate with the deposition shield; unmasking the exposed surfaces; and forming a protective barrier on the exposed surfaces. The present invention may also optionally include masking other non-exposed surfaces (e.g., the first surface of the electrode plate excluding the plenum cavity, the first sealing feature, the second sealing feature, the one or more third sealing features, the fourth sealing feature, and the distal end mating surface).

The present invention provides another method of producing the electrode plate with the deposition shield for the upper electrode in the plasma processing system comprising the steps: fabricating the electrode plate with the deposition shield; and forming a protective barrier on the exposed surfaces.

The present invention may also include a process of combining machining and masking to prepare the exposed surfaces to receive the protective barrier, and then forming the protective barrier on the exposed surfaces. For example, two of the exposed surfaces can be masked prior to anodizing, and two of the surfaces can be machined after anodizing to create four exposed surfaces on which the protective barrier can be formed.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved upper electrode for a plasma processing system, wherein the design and fabrication of the upper electrode advantageously addresses known shortcomings.

Figure 1:
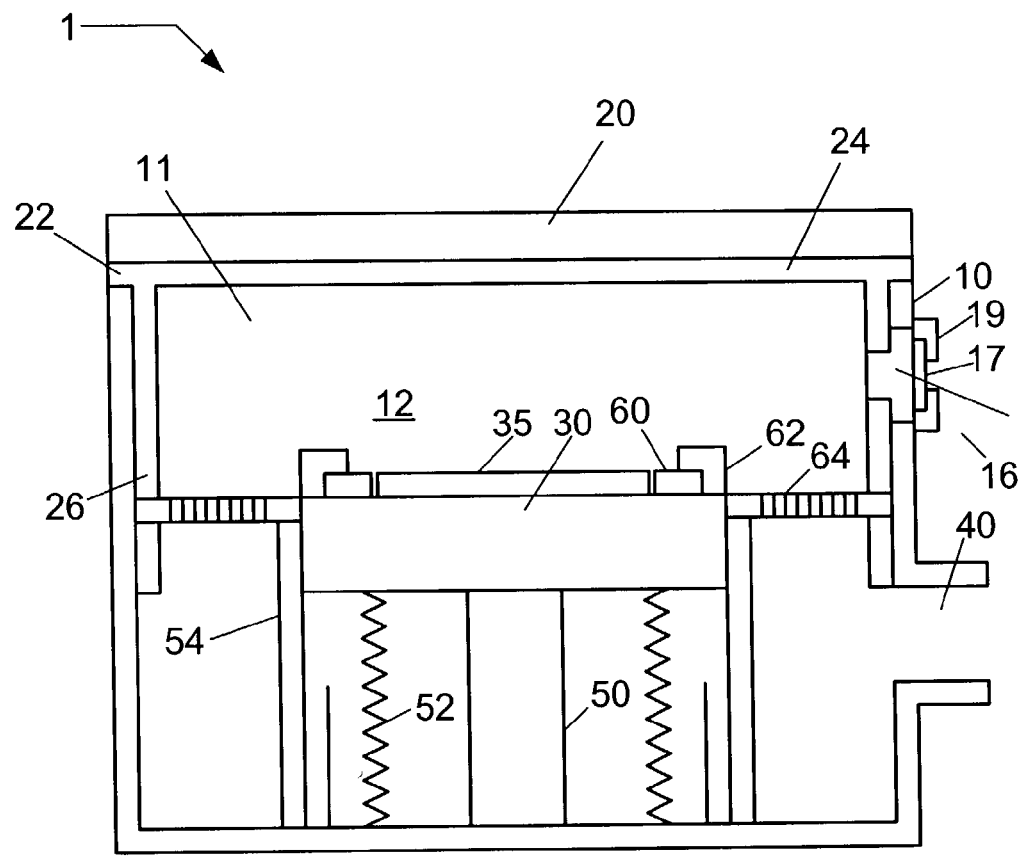
FIG. 1 shows a simplified block diagram of a plasma processing system comprising an upper electrode including an electrode plate with a deposition shield according to an embodiment of the present invention.

According to an embodiment of the present invention, a plasma processing system 1 is depicted in FIG. 1 comprising a plasma processing chamber 10, an upper assembly 20, an upper electrode 22, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of a processing plasma in a process space 12 adjacent substrate 35. The plasma processing system 1 can be configured to process various substrates (i.e., 200 mm substrates, 300 mm substrates, or larger).

Figure 2:
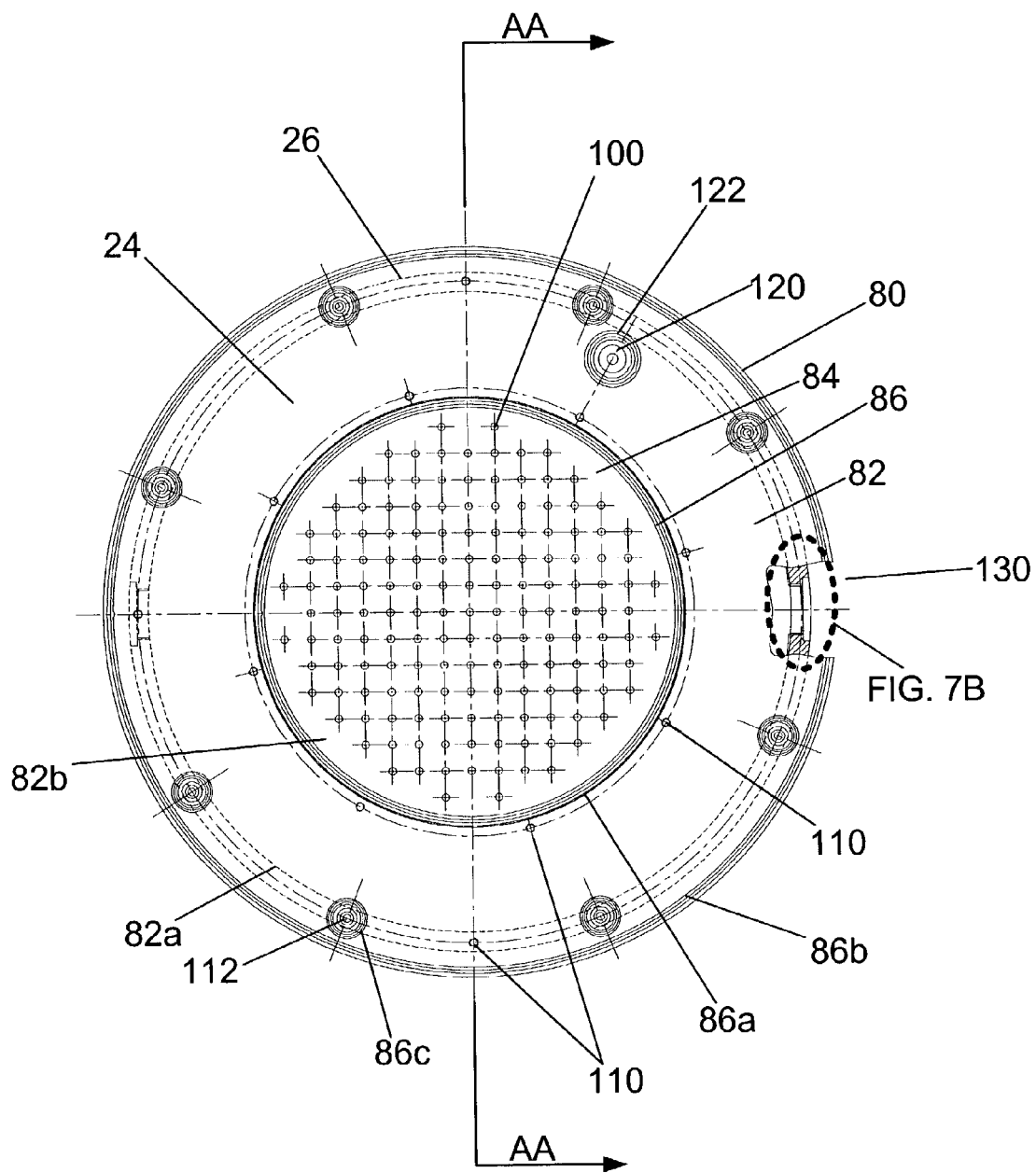
FIG. 2 shows a plan view of an electrode plate with a deposition shield for a plasma processing system according to an embodiment of the present invention.

In the illustrated embodiment, upper electrode 22 comprises an electrode plate 24 (FIG. 2) with a deposition shield 26 (FIG. 2). In an alternate embodiment, upper assembly 20 can comprise at least one of a cover, a gas injection assembly, and an upper electrode impedance match network. For example, the upper electrode 22 can be coupled to an RF source. In another alternate embodiment, the upper assembly 20 comprises a cover and an upper electrode 22, wherein the upper electrode is maintained at an electrical potential equivalent to that of the plasma processing chamber 10. For example, the plasma processing chamber 10, the upper assembly 20, and the upper electrode 22 can be electrically connected to ground potential.

Plasma processing chamber 10 can, for example, further comprise an optical viewport 16. Optical viewport 16 can comprise an optical window 17 coupled to the backside of an optical window deposition shield 18, that can be coupled to deposition shield 26, and an optical window flange 19 can be configured to couple optical window 17 to the optical window deposition shield 18. Sealing members, such as O-rings, can be provided between the optical window flange 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further comprise a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 10 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermoelectric heaters/coolers can be included.

In the illustrated embodiment, shown in FIG. 1, substrate holder 30 can comprise an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Referring now to an illustrated embodiment of the present invention depicted in FIGS. 2 (plan view) and 3 (cross-sectional view), upper electrode 22 comprises a cylindrical element having an electrode plate 24 and a deposition shield 26. The electrode plate 24 can comprise a first surface 82 for coupling the upper electrode 22 to the upper assembly 20, a second surface 88 comprising a plasma surface 90 configured to face the processing plasma in the plasma processing chamber 10 and a mating surface 92 for mating the upper electrode 22 with the plasma processing chamber 10, and a peripheral edge 94. The deposition shield 26 can comprise a cylindrical wall 70 coupled to electrode plate 24 and configured to extend therefrom. The cylindrical wall 70 can comprise an inner surface 72 contiguous with the plasma surface 90 of the electrode plate 24, an outer surface 74 contiguous with the mating surface 92 of the electrode plate 24, and a distal end surface 76.

Figure 4:
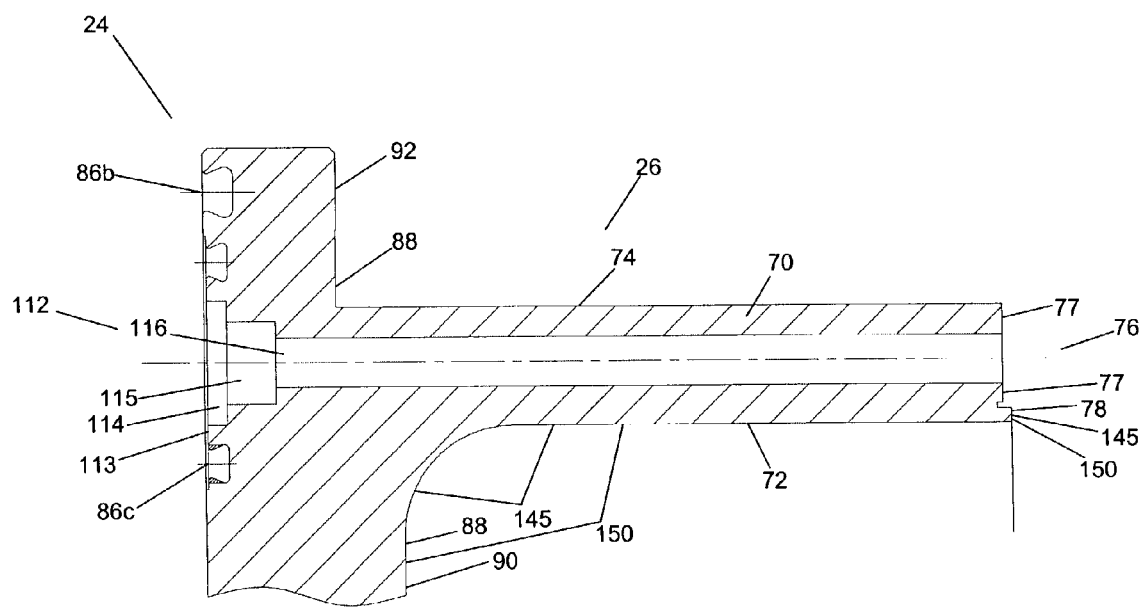
FIG. 4 shows an expanded cross-sectional view of an electrode plate with a deposition shield for the plasma processing system according to an embodiment of the present invention.

FIG. 4 provides an expanded view of the deposition shield 26 coupled to the electrode plate 24. As shown in FIG. 4, distal end surface 76 of cylindrical wall 70 further comprises a distal end mating surface 77 and a distal end lip surface 78, wherein the distal end lip surface 78 is contiguous with the inner surface 72 of the cylindrical wall 70. Alternately, electrode plate 24 with deposition shield 26 can further comprise one or more fastening through-holes 112 configured to extend the length of the cylindrical wall 70 and configured to receive fastening devices (not shown), such as a bolt, etc., in order to couple the upper electrode 22 to the plasma processing system 1. Each fastening through-hole 112 can comprise a first entrant fastening cavity 113, a second entrant fastening cavity 114, a third entrant fastening cavity 115, and a fastening passage 116. For example, the number of fastening through-holes 112 formed within electrode plate 24 can range from 1 to 100. Desirably, the number of fastening through-holes 112 can range from 5 to 20; and, preferably the number of fastening through-holes 112 is at least 8.

Figure 3:
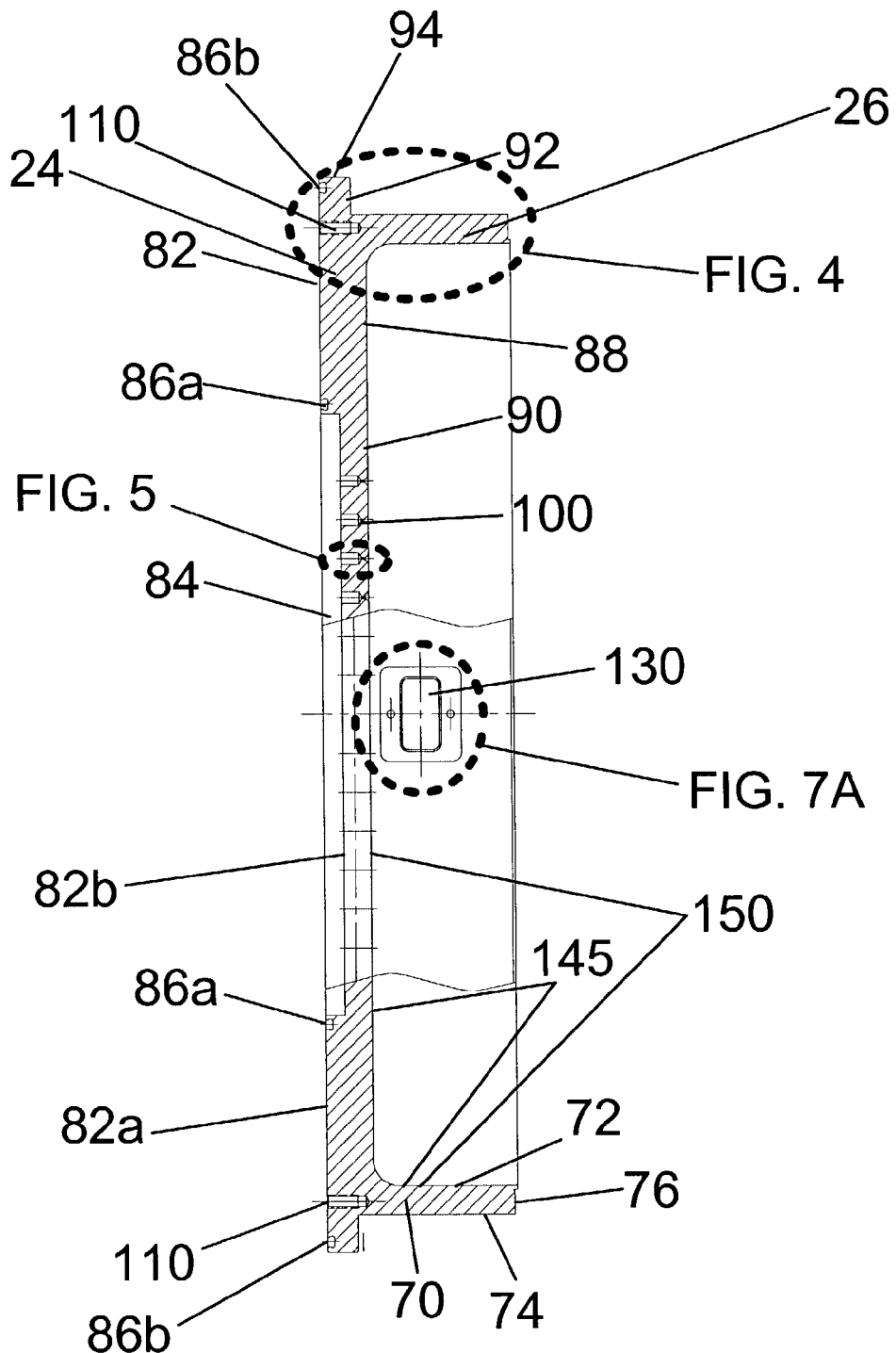
FIG. 3 shows a cross-sectional view of an electrode plate with a deposition shield for the plasma processing system according to an embodiment of the present invention.
Figure 5:
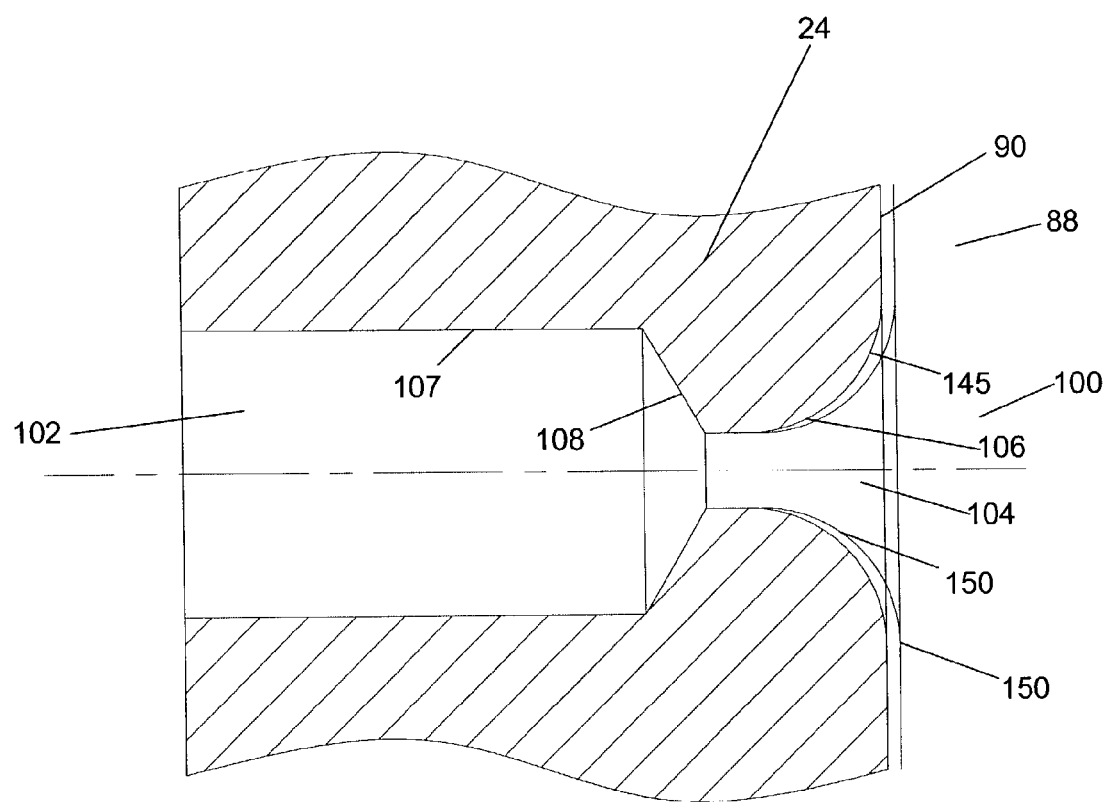
FIG. 5 shows an exploded view of a gas injection orifice in an electrode plate with a deposition shield for the plasma processing system according to an embodiment of the present invention.

With continuing reference to FIGS. 2 and 3, and as shown in FIG. 5, the electrode plate 24 further includes a plurality of gas injection orifices 100 coupled to the first surface 82 and the second surface 88, wherein each gas injection orifice 100 comprises an entrant region 102 for receiving a processing gas and an exit region 104 for coupling the processing gas to the plasma processing chamber 10. Furthermore, the interior surface of each gas injection orifice 100 can comprise an injection surface 106, a first entrant surface 107, and a second entrant surface 108. The processing gas can, for example, comprise a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/Ar/C_4F_8$, $O_2/CO/AR/C_5F_8$, $O_2/CO/Ar/C_4F_6$, $O_2/Ar/C_4F_6$, $N_2/H_2$.

For example, the number of gas injection orifices 100 formed within electrode plate 24 can range from 1 to 10000. Desirably, the number of gas injection orifices 100 ranges from 50 to 500; and preferably, the number of gas injection orifices 100 is at least 100. Furthermore, for example, a diameter of the gas injection orifice can range from 0.1 to 20 mm. Desirably, the diameter ranges from 0.5 to 5 mm, and preferably the diameter ranges from 0.5 to 2 mm. In addition, for example, a length of a gas injection orifice can range from 1 to 20 mm. Desirably, the length ranges from 2 to 15 mm, and preferably the length ranges from 3 to 12 mm.

Additionally, as shown in FIG. 3, electrode plate 24 comprises a plenum cavity 84 having a plenum surface 82b that is part of the first surface 82, configured to receive the processing gas, and configured to distribute the processing gas to the plurality of gas injection orifices 100.

Additionally, electrode plate 24 can comprise a first sealing feature 86a coupled to the coupling surface 82a of the electrode plate 24 and configured to seal the electrode plate 24 with the upper assembly 20. The first sealing feature can, for example, comprise a dovetail cross-section or rectangular cross-section configured for receiving an O-ring. In an alternate embodiment, an electrical coupling feature (not shown) can be integrated with the coupling surface 82a of the electrode plate 24 in order to provide improved electrical coupling between the electrode plate 24 and the upper assembly 20. The electrical coupling feature can, for example, comprise Spirashield (commercially available from Spira Manufacturing Company), known to those skilled in the art of vacuum processing.

Additionally, electrode plate 24 can comprise a second sealing feature 86b coupled to the coupling surface 82a of the electrode plate 24 and configured to seal the electrode plate 24 with the upper assembly 20. The second sealing feature can, for example, comprise a dovetail cross-section or rectangular cross-section configured for receiving an O-ring. In an alternate embodiment, an electrical coupling feature (not shown) can be integrated with the coupling surface 82a of the electrode plate 24 in order to provide improved electrical coupling between the electrode plate 24 and the upper assembly 20. The electrical coupling feature can, for example, comprise Spirashield (commercially available from Spira Manufacturing Company), known to those skilled in the art of vacuum processing.

Additionally, electrode plate 24 can comprise one or more third sealing features 86c coupled to the coupling surface 82a of the electrode plate 24 and configured to seal each of the one or more fastening through-holes 112 with the upper assembly 20. The second sealing feature can, for example, comprise a dovetail cross-section or rectangular cross-section configured for receiving an O-ring. In an alternate embodiment, an electrical coupling feature (not shown) can be integrated with the coupling surface 82a of the electrode plate 24 in order to provide improved electrical coupling between the electrode plate 24 and the upper assembly 20. The electrical coupling feature can, for example, comprise Spirashield (commercially available from Spira Manufacturing Company), known to those skilled in the art of vacuum processing.

The electrode plate 24 can further include a plurality of fastening receptors 110 for receiving fastening devices (not shown), such as a threaded bolt, in order to attach the electrode plate 24 to the upper assembly 20. For example, the number of fastening receptors 110 formed within electrode plate 24 can range from 1 to 100. Desirably, the number of fastening receptors 110 can range from 5 to 20; and, preferably the number of fastening receptors 110 is at least 8.

Figure 6:
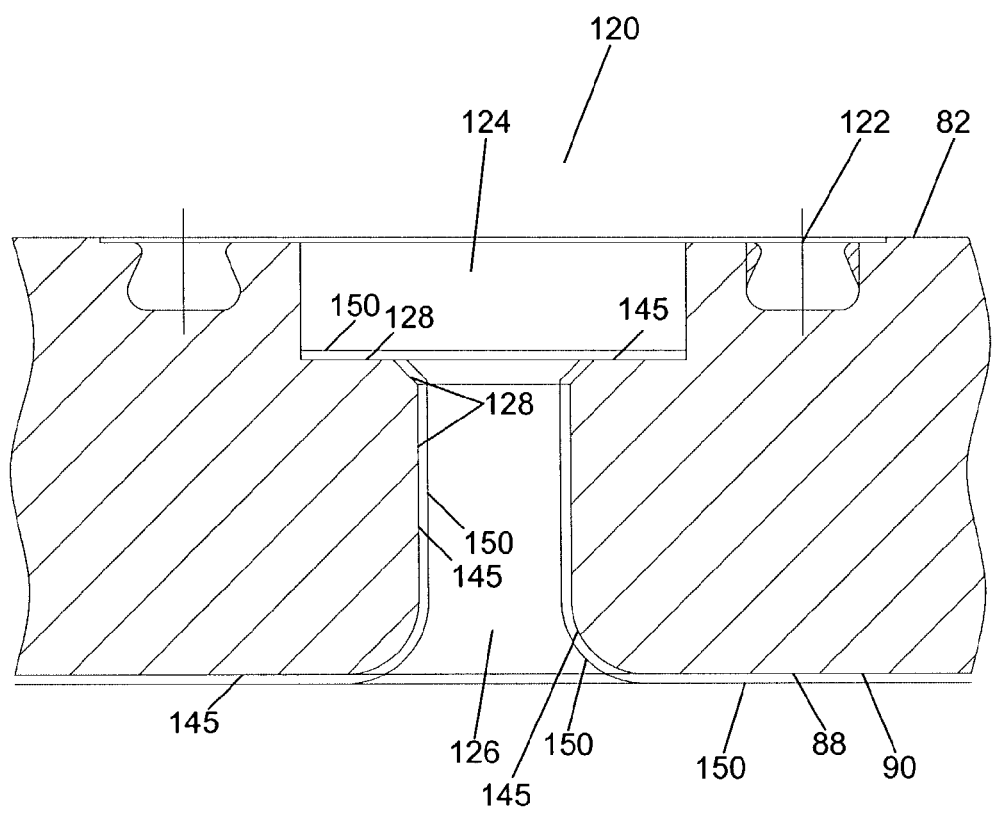
FIG. 6 shows an exploded view of an exit through-hole of a diagnostics port in an electrode plate with a deposition shield for the plasma processing system according to an embodiment of the present invention.

As shown in FIG. 2, the electrode plate 24 can further comprise a diagnostics port 120, and a fourth sealing feature 122 coupled to the coupling surface 82a of the electrode plate 24 and configured to seal the diagnostics port 120 with the upper assembly 20. As depicted in FIG. 6, the diagnostics port 120 can include an entrant cavity 124 and an exit through-hole 126 comprising an interior surface 128 contiguous with the plasma surface 90. Similarly, the second sealing feature can, for example, comprise a dovetail cross-section or rectangular cross-section configured for receiving an O-ring. The diagnostics port 120 can be used to couple a diagnostics system (not shown) with the reduced pressure atmosphere 11 of plasma processing chamber 10. For example, the diagnostics system can comprise a pressure manometer.

Referring again to FIG. 1, FIG. 2, and FIG. 3, deposition shield 26 can, for example, further comprise an opening 130 in order to accommodate access to the process space 12 through deposition shield 26. In an embodiment of the present invention, the opening 130 is formed in deposition shield 26 to accommodate the insertion of at least one of a chamber liner plug (not shown) or an optical window deposition shield such as the one depicted in FIG. 1. For further details, co-pending U.S. patent application Ser. No. 10/259,352, entitled "Method and apparatus for an improved optical window deposition shield in a plasma processing system", filed on even date herewith, is incorporated herein by reference in its entirety. Alternately, the opening 130 is not formed in deposition shield 26.

Figure 7A:
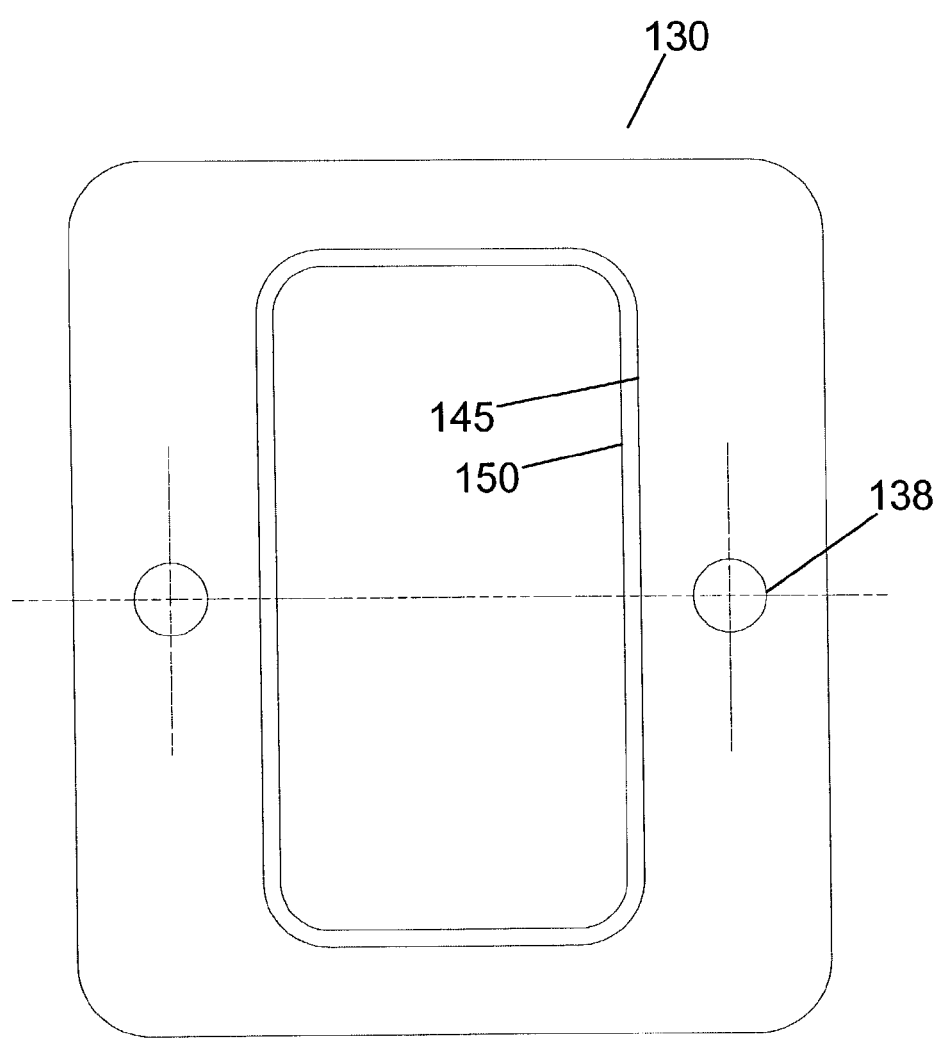
FIG. 7A presents an expanded view of an opening in a deposition shield for a plasma processing system according to an embodiment of the present invention.
Figure 7B:
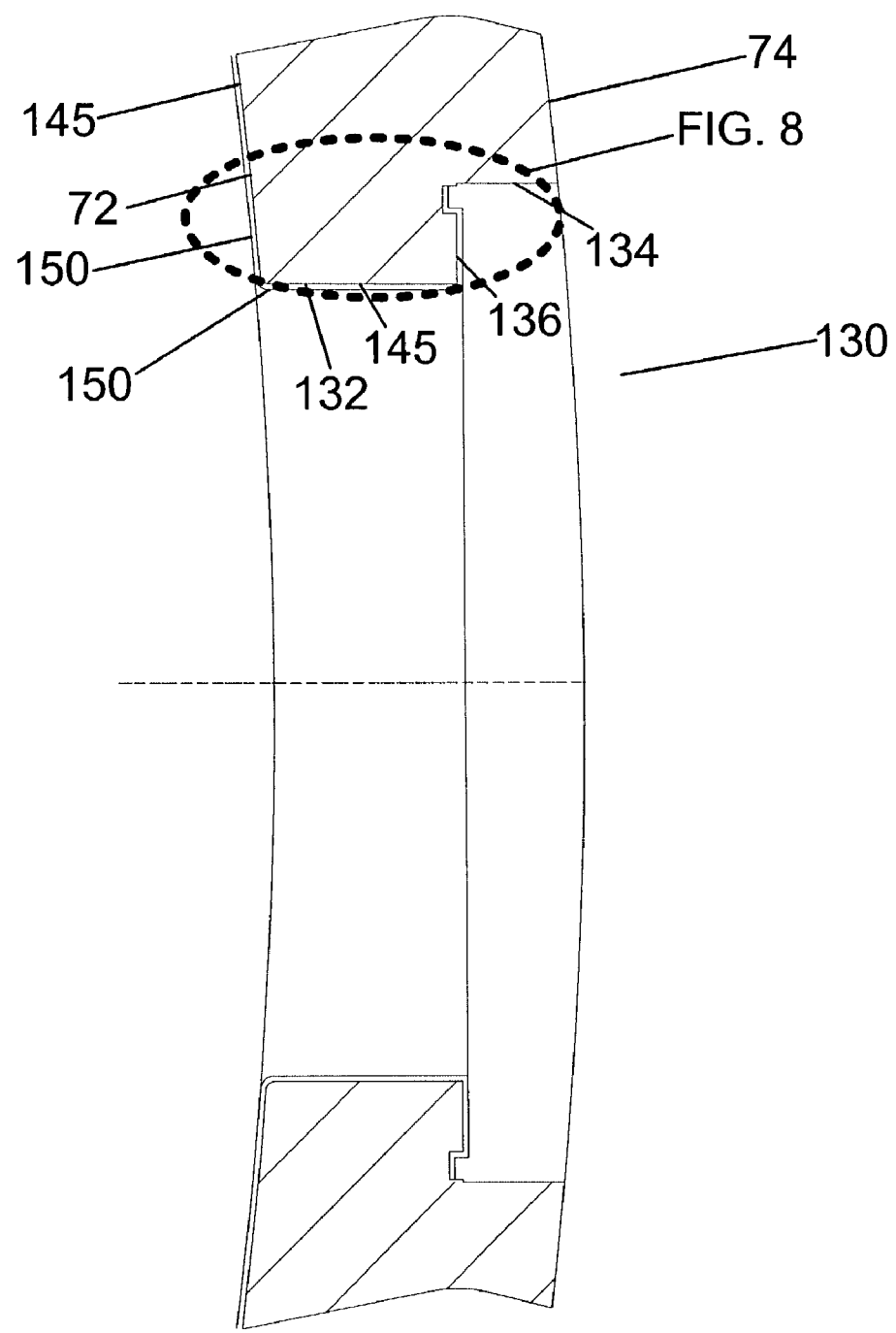
FIG. 7B presents an expanded cross sectional view of an opening taken along a major axis of the opening for a plasma processing system according to an embodiment of the present invention.

In FIGS. 7A and 7B, an expanded view of opening 130 in deposition shield 26 and a cross sectional view of opening 130, taken along a major axis of opening 130, respectively, are presented. As depicted in FIG. 7B, opening 130 can further comprise a first opening surface 132 coupled to the inner surface 72 of the deposition shield 26, a second mating surface 134 coupled to the outer surface 74 of the deposition shield 26, and a mating surface 136 coupled to the first opening surface 132 and to the second opening surface 134. In addition, the mating surface 136 can comprise at least one tapped hole 138 for receiving a threaded fastener (not shown) in order to couple at least one of the chamber plug (not shown) or the optical window deposition shield (not shown) to the deposition shield 26.

Figure 8:
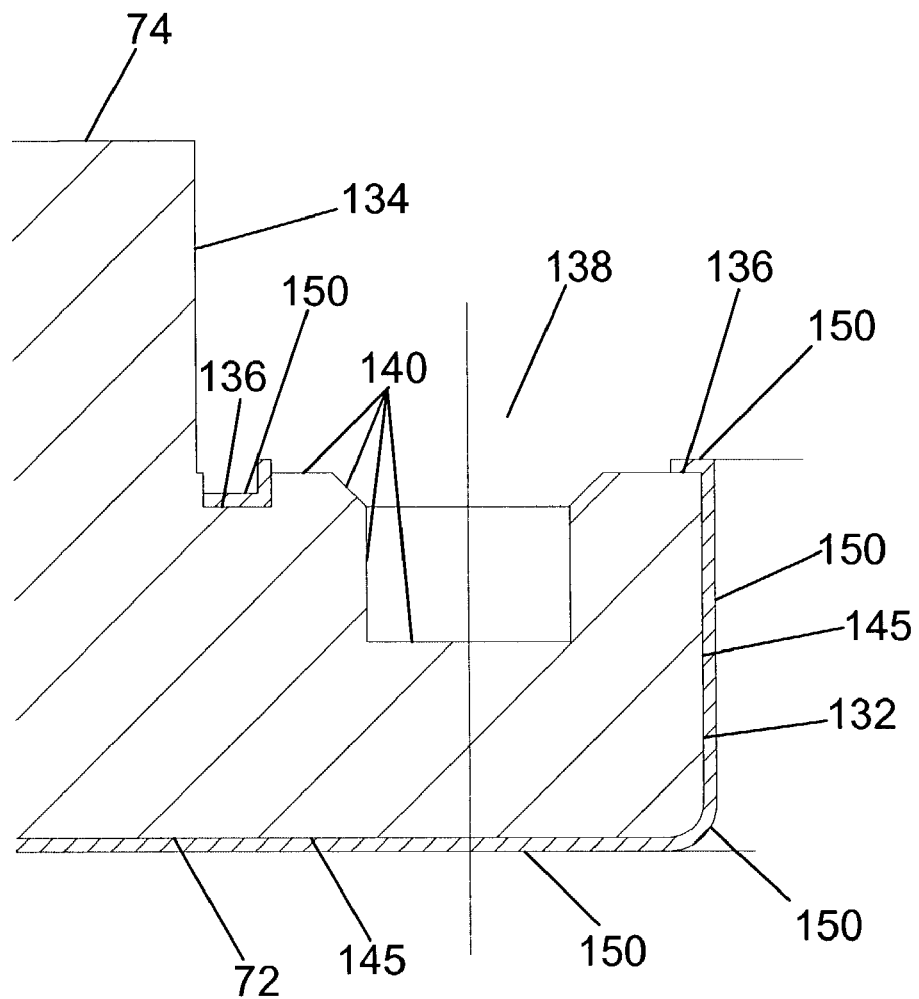
FIG. 8 shows a cross sectional view of a mating surface and a fastening surface of an opening for a plasma processing system according to another embodiment of the present invention.

As shown in FIG. 8, the mating surface 136 further comprises a fastening surface 140 immediately adjacent to and extending within the tapped hole 138. Furthermore, for example, a width (along a major axis) of the opening 130 can range from 1 to 100 mm. Desirably, the width can range from 10 to 40 mm, and preferably, the width is at least 25 mm. Furthermore, for example, a height (along a minor axis) of the opening 130 can range from 1 to 100 mm. Desirably, the height can range from 10 to 40 mm, and preferably, the height is at least 15 mm.

As illustrated in FIGS. 2 through 8, a plurality of exposed surfaces 145 can comprise the plasma surface 90 (FIG. 3) of the second surface 88 of the electrode plate 24, the inner surface 72 of the cylindrical wall 70 of the deposition shield 26 (FIG. 4), and the distal end lip surface 78 of the distal end surface 76 of the deposition shield 26 (FIG. 4). Additionally, the exposed surfaces 145 can comprise the injection surface 106 (FIG. 5) of the exit region 104 in the plurality of gas injection orifices 100, the interior surface 128 of the exit through-hole 126 in the diagnostics port 120 (FIG. 6), the first opening surface 132 of the opening 130 (FIG. 8), and the mating surface 136 excluding the fastening surface 140 of the opening in the deposition shield (FIG. 8). Alternately, the exposed surfaces comprise all surfaces on the electrode plate 24 with deposition shield 26.

Referring now to FIGS. 2 through 8, the electrode plate 24 with the deposition shield 26 further comprises a protective barrier 150 formed on the exposed surfaces 145 of the electrode plate 24 with the deposition shield 26. In an embodiment of the present invention, the protective barrier 150 can comprise a compound including an oxide of aluminum such as $Al_2O_3$. In another embodiment of the present invention, the protective barrier 150 can comprise a mixture of $Al_2O_3$ and $Y_2O_3$. In another embodiment of the present invention, the protective barrier 150 can comprise at least one of a III-column element (column III of periodic table) and a Lanthanon element. In another embodiment of the present invention, the III-column element can comprise at least one of Yttrium, Scandium, and Lanthanum. In another embodiment of the present invention, the Lanthanon element can comprise at least one of Cerium, Dysprosium, and Europium. In another embodiment of the present invention, the compound forming protective barrier 150 can comprise at least one of Yttria ($Y_2O_3$), $Sc_2O_3$, $Sc_2F_3$, $YF_3$, $La_2O_3$, $CeO_2$, $Eu_2O_3$, and $DyO_3$.

In an embodiment of the present invention, the protective barrier 150 formed on electrode plate 24 with the deposition shield 26 comprises a minimum thickness, wherein the minimum thickness can be specified as constant across at least one of the exposed surfaces 145. In another embodiment, the minimum thickness can be variable across the exposed surfaces 145. Alternately, the minimum thickness can be constant over a first portion of an exposed surface and variable over a second portion of the exposed surface. For example, a variable thickness can occur on a curved surface, on a corner, or in a hole. For example, the minimum thickness can range from 0.5 micron to 500 micron. Desirably; the minimum thickness can range from 100 micron to 200 micron; and preferably, the minimum thickness is at least 120 micron.

Figure 9:
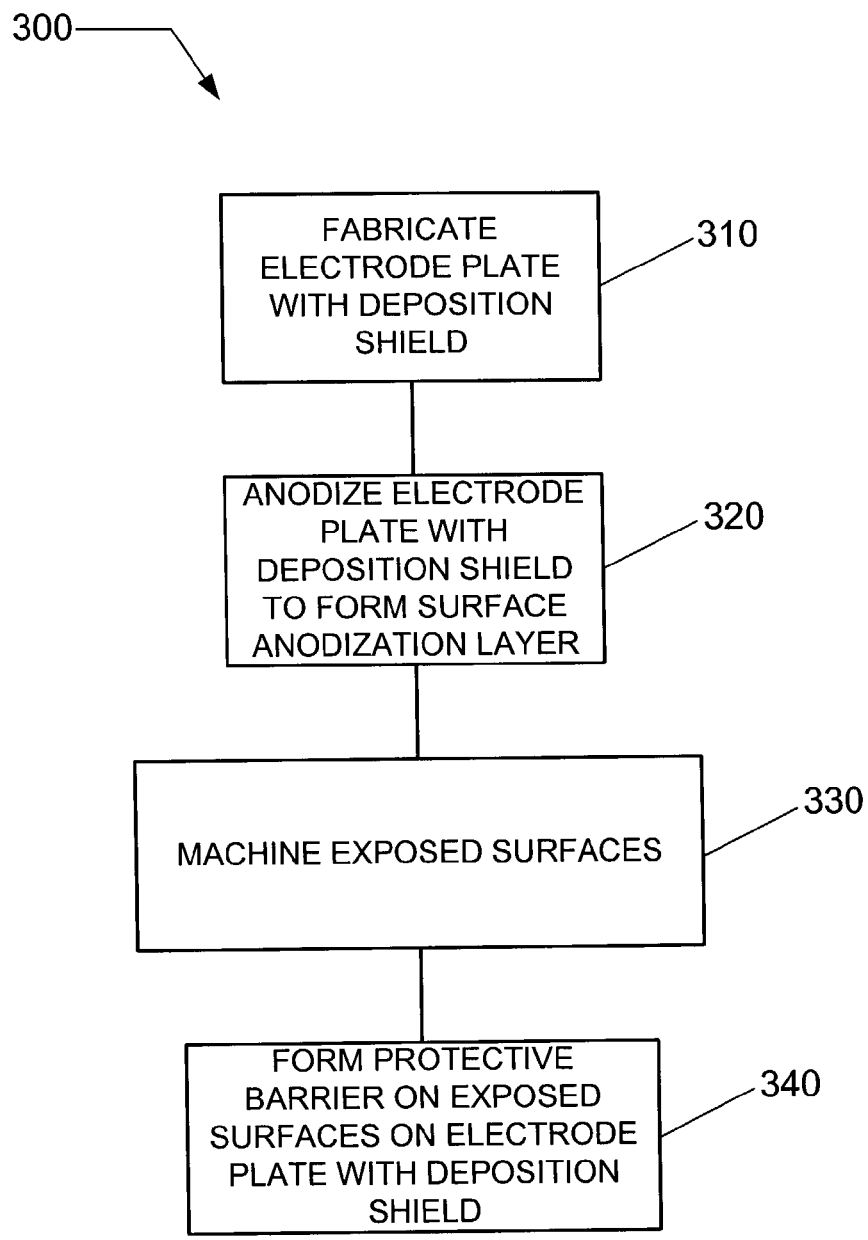
FIG. 9 presents a method of producing an electrode plate with a deposition shield for the plasma processing system according to an embodiment of the present invention.

FIG. 9 presents a method of producing the electrode plate with the deposition shield for the upper electrode in the plasma processing system described in FIG. 1 according to an embodiment of the present invention. A flow diagram 300 begins in 310 with fabricating an electrode plate with the deposition shield (e.g., a plate and shield having the characteristics of the plate and shield described with reference to FIGS. 2–8). Fabricating the electrode plate with the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate with the deposition shield can, for example, be fabricated from aluminum.

In 320, the electrode plate 24 with the deposition shield 26 is anodized to form a surface anodization layer. For example, when fabricating the electrode plate 24 with the deposition shield 26 from aluminum, the surface anodization layer comprises aluminum oxide ($Al_2O_3$). Methods of anodizing aluminum components are well known to those skilled in the art of surface anodization.

In 330, the surface anodization layer is removed from the exposed surfaces using standard machining techniques. During the same machining step, or during a separate machining step, other surfaces (e.g., the first surface of the electrode plate excluding the plenum cavity, the first sealing feature, the second sealing feature, the one or more third sealing features, the fourth sealing feature, and the distal end mating surface of the deposition shield) may also be machined (e.g., to produce a flat or bare surface that provides at least one of a good mechanical or electrical contact at the machined surface).

In 340, a protective barrier 150 (as described above) is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 10:
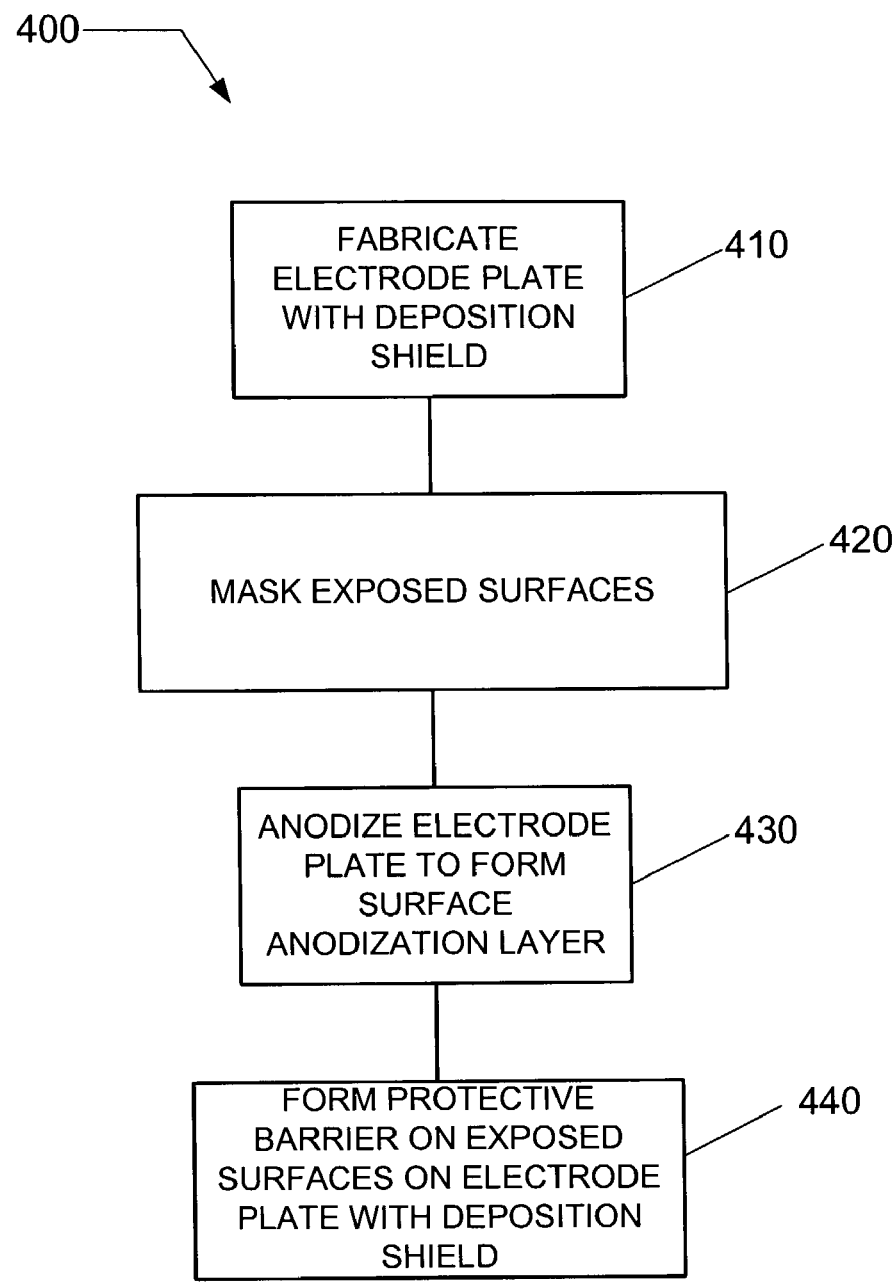
FIG. 10 presents a method of producing an electrode plate with a deposition shield for the plasma processing system according to another embodiment of the present invention.

FIG. 10 presents a method of fabricating the electrode plate with the deposition shield for the upper electrode in the plasma processing system described in FIG. 1 according to another embodiment of the present invention. A flow diagram 400 begins in 410 with machining an electrode plate 24 with a deposition shield 26. Fabricating the electrode plate with the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate with the deposition shield can, for example, be fabricated from aluminum.

In 420, exposed surfaces 145 are masked to prevent the formation of a surface anodization layer thereon. Techniques for surface masking and unmasking are well known to those skilled in the art of surface coatings and surface anodization. During the same masking step, or during a separate masking step, other surfaces (e.g., the first surface of the electrode plate excluding the plenum cavity, the first sealing feature, the second sealing feature, the one or more third sealing features, the fourth sealing feature, and the distal end mating surface of the deposition shield) may also be masked (e.g., to maintain a flat or bare surface that provides at least one of a good mechanical or electrical contact at the machined surface).

In 430, the electrode plate with the deposition shield is anodized to form a surface anodization layer on the remaining unmasked surfaces. For example, when fabricating the electrode plate with the deposition shield from aluminum, the surface anodization layer comprise aluminum oxide ($Al_2O_3$). Methods of anodizing aluminum components are well known to those skilled in the art of surface anodization.

In 440, the exposed surfaces 145 are unmasked, and a protective barrier 150 is formed on the exposed surfaces 145. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

Figure 11:
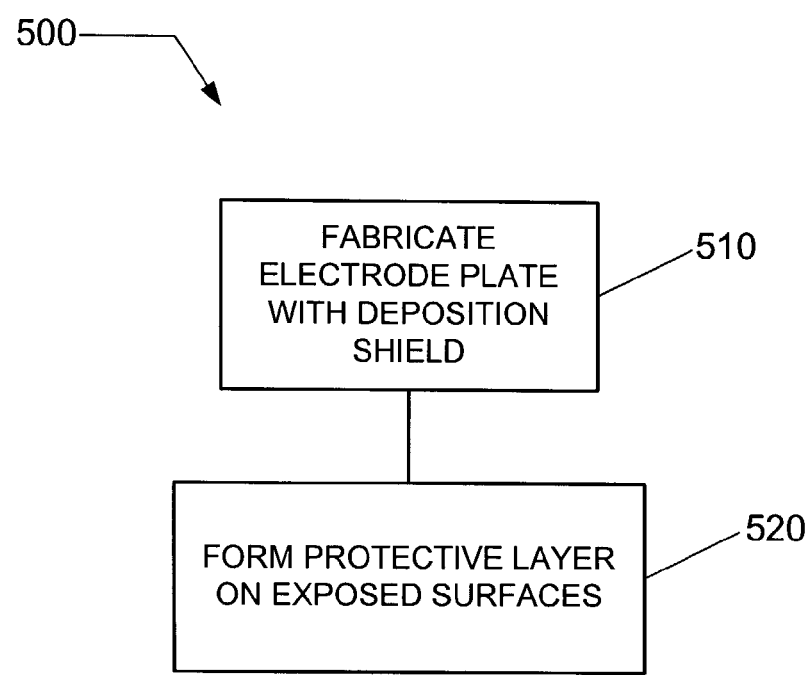
FIG. 11 presents a method of producing an electrode plate with a deposition shield for the plasma processing system according to another embodiment of the present invention.

FIG. 11 presents a method of producing the electrode plate with the deposition shield in the plasma processing system described in FIG. 1 according to another embodiment of the present invention. A flow diagram 500 begins in 510 with fabricating an electrode plate 24 with a deposition shield 26. Fabricating the electrode plate with the deposition shield can comprise at least one of machining, casting, polishing, forging, and grinding. For example, each of the elements described above can be machined according to specifications set forth on a mechanical drawing, using conventional techniques including a mill, a lathe, etc. The techniques for machining a component using, for example, a mill or a lathe, are well known to those skilled in the art of machining. The electrode plate can, for example, be fabricated from aluminum.

In 520, a protective barrier 150 (as described above) is formed on the exposed surfaces 145 of the electrode plate. A protective barrier comprising, for example Yttria, can be formed using (thermal) spray coating techniques that are well known to those skilled in the art of ceramic spray coatings. In an alternate embodiment, forming the protective barrier can further comprise polishing the thermal spray coating. For example, polishing the thermal spray coating can comprise the application of sand paper to the sprayed surfaces.

In an alternate embodiment of the present invention, a mixture of masking and machining prepares the proper number of surfaces to be protected with a protective barrier 150. For example, the plasma surface of the second surface of the electrode plate may be masked to prevent an anodization layer from being formed thereon, while the injection surface of the exit region in the plurality of gas injection orifices is machined after anodization to present a bare, exposed surface.

While not necessary in order to form the protective barrier 150 on the exposed surfaces 145, it is also possible to machine other non-exposed surfaces on which an anodization layer has been formed or to mask other non-exposed surfaces prior to performing anodization (e.g., in order to provide a bare surface for an electrical or mechanical connection between parts). Such surfaces may include surfaces of sealing or mating features.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An upper electrode assembly for a plasma processing system, comprising:
   an electrode plate comprising a first surface for coupling said upper electrode to an upper assembly, a second surface comprising a plasma surface and a mating surface for mating said electrode plate with said plasma processing system, a peripheral edge, and a plurality of gas injection orifices coupled to said first surface and said second surface;
   a deposition shield attached said electrode plate, said deposition shield comprising a cylindrical wall having an inner surface contiguous with said plasma surface, an outer surface contiguous with said mating surface, and a distal end surface, wherein said distal end surface comprises:
      a distal end mating surface extending radially inward from said outer surface, and
      a protrusion adjacent to said inner surface and protruding from said distal end mating surface, said protrusion having a distal end lip surface thereon; and
   a protective barrier provided on exposed surfaces of said upper electrode assembly, said exposed surfaces comprising said plasma surface, said inner surface, and said distal end lip surface.

2. The upper electrode assembly as recited in claim 1, wherein said electrode plate further comprises a plenum cavity formed in said first surface, said plenum cavity having a plenum surface having said plurality of gas injection orifices formed therein such that said plenum cavity receives said processing gas and distributes said processing gas to said plurality of gas injection orifices.

3. The upper electrode assembly as recited in claim 1, wherein said electrode plate further comprises at least one of a first sealing feature and a second sealing feature coupled to said first surface and configured to seal said electrode plate to said upper electrode.

4. The upper electrode assembly as recited in claim 1, wherein said electrode plate further comprises a diagnostics port that couples a diagnostics system to said plasma processing system, and a fourth sealing feature configured to seal said diagnostics port when said upper electrode is coupled to said upper assembly.

5. The upper electrode assembly as recited in claim 1, wherein said protective barrier comprises $Al_2O_3$.

6. The upper electrode assembly as recited in claim 1, wherein said protective barrier comprises a mixture of $Al_2O_3$ and $Y_2O_3$.

7. The upper electrode assembly as recited in claim 1, wherein said protective barrier comprises a compound containing at least one of a group III element and a Lanthanon element.

8. The upper electrode assembly as recited in claim 7, wherein said group III element comprises at least one of Yttrium, Scandium, and Lanthanum.

9. The upper electrode assembly as recited in claim 7, wherein said Lanthanon element comprises at least one of Cerium, Dysprosium, and Europium.

10. The upper electrode assembly as recited in claim 1, wherein said protective barrier comprises at least one of Yttria ($Y_2O_3$), $Sc_2O_3$, $Sc_2F_3$, $YF_3$, $La_2O_3$, $CeO_2$, $Eu_2O_3$, and $DyO_3$.

11. The upper electrode assembly as recited in claim 1, wherein said gas injection orifice comprises an entrant region, and an exit region, wherein said exit region comprises an injection surface.

12. The upper electrode assembly as recited in claim 1, further comprising one or more fastening through-holes coupled to said first surface of said electrode plate, extending through said electrode plate and said deposition shield and coupled to a distal end mating surface of said distal end surface, wherein:
   said fastening through hole configured to couple said electrode plate and said deposition shield to said plasma processing system, and
   each of said one or more fastening through-holes comprises a third sealing feature that seals said one or more fastening through-holes when said upper electrode is coupled to said upper assembly.

13. The upper electrode assembly as recited in claim 1, wherein said protective barrier comprises a minimum thickness and said minimum thickness is constant across at least one of said exposed surfaces.

14. The upper electrode assembly as recited in claim 1, wherein said protective barrier comprises a variable thickness, said variable thickness ranging from 0.5 microns to 500 microns.

15. The upper electrode assembly as recited in claim 1, wherein at least one gas injection orifice has a diameter that is at least 0.1 mm.

16. The upper electrode assembly as recited in claim 1, wherein at least one gas injection orifice has a length that is at least 1.0 mm.

17. The upper electrode assembly as recited in claim 11, wherein said exposed surfaces includes said injection surface of said plurality of gas injection orifices.

18. The upper electrode assembly as recited in claim 4, wherein said exposed surfaces, having said protective barrier provided thereon, comprises said interior surface of said diagnostics port.

19. The upper electrode assembly as recited in claim 1, wherein said deposition shield further comprises an opening in order to access said process space through said deposition shield.

20. The upper electrode assembly as recited in claim 19, wherein said opening comprises:
   a first opening surface extending radially inward from said outer surface;
   a second opening surface extending radially outward from said inner surface; and
   a mating surface coupling said first opening surface to said second opening surface.

21. The upper electrode assembly as recited in claim 20, wherein said mating surface comprises at least one tapped hole and a fastening surface coupled thereto.

22. The upper electrode assembly shield as recited in claim 20, wherein said exposed surfaces, having said protective barrier provided thereon, further comprise said first opening surface of said opening, and said mating surface of said opening in said deposition shield.

23. The upper electrode assembly as recited in claim 21, wherein said exposed surfaces, having said protective barrier provided thereon, further comprise said first opening surface of said opening, and said mating surface excluding said fastening surface of said opening in said deposition shield.

24. An upper electrode assembly for a plasma processing chamber comprising:
   a cylindrical element having a first surface, a mating surface, a peripheral edge coupled to said first surface and said mating surface, an outer surface coupled to said mating surface, an inner surface coupled to said outer surface by a distal end surface, and a plasma surface coupled to said inner surface, wherein:
      said first surface comprises a coupling surface for coupling said upper electrode to said plasma processing chamber and a plenum cavity formed in said first surface and
      said distal end surface comprises a first surface extending radially inward from said outer surface, and a protrusion adjacent to said inner surface and protruding from said first surface, said protrusion having a distal end lip surface thereon, and
      said cylindrical element further comprising a plurality of gas injection orifices coupled to said plenum cavity and said plasma surface; and
   a protective barrier coupled to exposed surfaces of said upper electrode, said exposed surfaces comprising said plasma surface, said inner surface, and said distal end lip surface.

25. The upper electrode assembly as recited in claim 24, wherein said upper electrode assembly further comprises at least one sealing feature located on said first surface at a position radially outside said plenum cavity and configured to receive a seal.

26. The upper electrode assembly as recited in claim 24, wherein said upper electrode further comprises:
   a plurality of fastening through-holes coupled to said first surface, extending through said electrode plate and said deposition shield and coupled to a distal end mating surface of said distal end surface, said plurality of through-holes configured to receive a fastening device, and
   a plurality of sealing features, each sealing feature located on said first surface surrounding one of the through-holes, and configured to receive a seal.

27. The upper electrode assembly as recited in claim 24, wherein said upper electrode further comprises a plurality of fastener receptors coupled to said first surface and configured to receive a fastener.

28. The upper electrode assembly as recited in claim 24, wherein each gas injection orifice comprises an entrant region coupled to said plenum cavity, and an exit region, said exit region comprising an injection surface coupled to said plasma surface.

29. The upper electrode assembly as recited in claim 28, wherein said exposed surfaces, having said protective barrier thereon, include each injection surface of said plurality of gas injection orifices.

30. The upper electrode assembly as recited in claim 24, wherein said upper electrode is formed of a metal.

31. The upper electrode assembly as recited in claim 30, wherein said metal comprises aluminum.

32. The upper electrode assembly as recited in claim 24, wherein said protective barrier comprises a compound containing at least one of a group III element and a Lanthanon element.

33. The upper electrode assembly as recited in claim 32, wherein said group III element comprises at least one of Yttrium, Scandium, and Lanthanum.

34. The upper electrode assembly as recited in claim 32, wherein said Lanthanon element comprises at least one of Cerium, Dysprosium, and Europium.

35. The upper electrode assembly as recited in claim 24, wherein said protective barrier comprises at least one of $Al_2O_3$, $Y_2O_3$, $Sc_2O_3$, $Sc_2F_3$, $YF_3$, $La_2O_3$, $CeO_2$, $Eu_2O_3$, and $DyO_3$.

36. The upper electrode assembly as recited in claim 24, wherein said first surface comprises an anodization layer.

37. The upper electrode assembly as recited in claim 24, wherein said plenum cavity comprises an anodization layer.

38. The upper electrode assembly as recited in claim 24, wherein said mating surface comprises a metallic surface.

39. The upper electrode assembly as recited in claim 24, wherein said protective barrier comprises a minimum thickness and said minimum thickness is constant across at least one of said exposed surfaces.

40. The upper electrode assembly as recited in claim 24, wherein said protective barrier comprises a variable thickness, said variable thickness ranging from 0.5 microns to 500 microns.

41. The upper electrode assembly as recited in claim 24, wherein at least one gas injection orifice has a diameter that is at least 0.1 mm.

42. The upper electrode assembly as recited in claim 24, wherein at least one gas injection orifice has a length that is at least 1.0 mm.

43. The upper electrode assembly as recited in claim 24, wherein said upper electrode further comprises:
 a diagnostics port having an interior surface coupled to said first surface and said plasma surface; and
 a fourth sealing feature located on said first surface, surrounding said diagnostic port, and configured to receive a seal.

44. The upper electrode assembly as recited in claim 43, wherein said exposed surfaces further comprise said interior surface.

45. The upper electrode assembly as recited in claim 24, wherein said upper electrode further comprises an opening coupled between said outer surface and said inner surface.

46. The upper electrode assembly as recited in claim 45, wherein said opening comprises a first opening surface coupled to the inner surface, a second opening surface coupled to the outer surface, and a mating surface coupled to the first opening surface and to the second opening surface.

47. The upper electrode assembly as recited in claim 46, wherein said mating surface comprises at least one tapped hole and a fastening surface coupled thereto.

48. The upper electrode assembly as recited in claim 46, wherein said exposed surfaces further comprise said first opening surface and said mating surface excluding said fastening surface.

49. The upper electrode assembly as recited in claim 2, wherein said plurality of gas injection orifices each comprise:
 an entrant region that opens to said plenum surface; and
 an exit region that opens to said second surface, wherein said exit region comprises an injection surface.

50. The upper electrode assembly as recited in claim 49, wherein said entrant region has a larger diameter than said exit region, said plurality of gas injection orifices each further comprising a tapered transition that couples said entrant region to said exit region.

51. The upper electrode assembly as recited in claim 2, wherein said protective barrier is provided on at least a portion of each of said plurality of gas injection orifices.

52. The upper electrode assembly as recited in claim 51, wherein said protective barrier is provided on only a portion of each of said plurality of gas injection orifices.

53. The upper electrode assembly as recited in claim 50, wherein said protective barrier is provided on said exit region, and said protective barrier is not provided on said entrant region.

54. The upper electrode assembly as recited in claim 53, wherein at least a portion of said entrant region is anodized.

55. The upper electrode assembly as recited in claim 4, wherein said diagnostics port comprises:
 an entrant cavity opening to said first surface, and
 an exit through-hole coupled to said entrant cavity, and opening to said second surface.

56. The upper electrode assembly as recited in claim 55, wherein said protective barrier is provided on at least a portion of said diagnostics port.

57. The upper electrode assembly as recited in claim 56, wherein said protective barrier is provided on only a portion of said diagnostics port.

58. The upper electrode assembly as recited in claim 55, wherein
 said entrant cavity comprises a bottom surface adjacent to said exit through hole,
 said exit through hole comprises a tapered opening coupling said bottom surface to said exit through hole,
 said protective barrier is provided on said bottom surface, said tapered opening and a remaining portion of said exit through hole, and
 said protective barrier is not provided on a remaining portion of said entrant cavity.

59. The upper electrode assembly as recited in claim 58, wherein said remaining portion of said entrant cavity is anodized.

60. The upper electrode assembly as recited in claim 21, further comprising a recess recessed from said mating surface, said recess being positioned between said tapped hole and said second opening surface.

61. The upper electrode assembly as recited in claim 60, wherein:
 said protective barrier comprises a first protective barrier area provided on a portion of said mating surface extending from said first opening surface, and a second protective barrier area provided on a portion of said recess including a sidewall of said recess adjacent to said tapped hole, and
 said fastening surfaces include a first fastening surface extending from said first protective barrier area to said tapped hole, and a second fastening surface extending from said second protective barrier area to said tapped hole.

62. The upper electrode assembly as recited in claim 61, wherein:
 said outer surface and said second opening surface are anodized, and
 said tapped hole and said first and second fastening surfaces are not anodized and do not have said protective barrier provided thereon.

63. The upper electrode assembly as recited in claim 1, further comprising a recess radially positioned between said distal end mating surface and said protrusion, said recess being recessed from said distal end mating surface.

64. The upper electrode assembly as recited in claim 63, wherein said protective barrier is provided on said end lip surface and said protective barrier is not provided on said recess.

65. An upper electrode assembly for a plasma processing system comprising:
 an electrode plate comprising a first surface for coupling said upper electrode assembly to an upper assembly, a second surface comprising a plasma surface and a mating surface for mating said electrode plate with said plasma processing system, a peripheral edge, and a plurality of gas injection orifices coupled to said first surface and said second surface;

a deposition shield attached to said electrode plate, said deposition shield comprising a cylindrical wall having an inner surface contiguous with said plasma surface, an outer surface contiguous with said mating surface, a distal end surface, and an opening formed in said cylindrical wall and having an opening surface extending from said inner surface to said outer surface; and a protective barrier provided on said plasma surface, said inner surface, and only a portion of said opening surface, wherein said opening surface comprises:

a first opening surface extending radially inward from said outer surface, a second opening surface extending radially outward from said inner surface, a mating surface coupling said first opening surface to said second opening surface, at least one tapped hole in said mating surface, and a fastening surface coupled to said at least one tapped through-hole.

66. The upper electrode assembly shield as recited in claim 65, wherein said protective barrier is provided on said first opening surface of said opening, and said mating surface excluding said fastening surface of said opening in said deposition shield.

67. The upper electrode assembly as recited in claim 65, wherein said electrode plate further comprises a plenum cavity formed in said first surface, said plenum cavity having a plenum surface having said plurality of gas injection orifices formed therein such that said plenum cavity receives said processing gas and distributes said processing gas to said plurality of gas injection orifices.

68. The upper electrode assembly as recited in claim 67, wherein said electrode plate further comprises a diagnostics port radially positioned between said plenum cavity and said peripheral edge, which couples a diagnostics system to said plasma processing system.

69. The upper electrode assembly as recited in claim 68, further comprising one or more fastening through-holes coupled to said first surface of said electrode plate, extending through said electrode plate and said deposition shield and coupled to a distal end mating surface of said distal end surface, wherein:

said fastening through hole is radially positioned between said plenum cavity and said peripheral edge, and is configured to couple said electrode plate and said deposition shield to said plasma processing system.

70. The upper electrode assembly as recited in claim 69 further comprising one or more fastening receptors positioned radially between said peripheral edge and said plenum cavity.

71. The upper electrode assembly as recited in claim 70 further comprising:

a first annular sealing feature radially positioned between said plenum cavity and said fastening receptors;

a second annular sealing feature radially positioned between said fastening through-hole and said peripheral edge;

a third sealing feature surrounding said fastening through hole; and a fourth sealing feature surrounding said diagnostics port.

72. An upper electrode assembly for a plasma processing system comprising:

an electrode plate comprising a first surface for coupling said upper electrode assembly to an upper assembly, a second surface comprising a plasma surface and a mating surface for mating said electrode plate with said plasma processing system, a peripheral edge, and a plurality of gas injection orifices coupled to said first surface and said second surface;

a deposition shield attached to said electrode plate, said deposition shield comprising a cylindrical wall having an inner surface contiguous with said plasma surface, an outer surface contiguous with said mating surface, a distal end surface, and an opening formed in said cylindrical wall and having an opening surface extending from said inner surface to said outer surface; and a protective barrier provided on said plasma surface, said inner surface, and only a portion of said opening surface, wherein said distal end surface comprises:

a distal end mating surface extending radially inward from said outer surface, and a protrusion adjacent to said inner surface and protruding from said distal end mating surface, said protrusion having a distal end lip surface thereon.

73. The upper electrode assembly as recited in claim 72, further comprising a recess radially positioned between said distal end mating surface and said protrusion, said recess being recessed from said distal end mating surface.

74. The upper electrode assembly as recited in claim 73, wherein said protective barrier is provided on said end lip surface and said protective barrier is not provided on said recess.

75. The upper electrode assembly as recited in claim 65, wherein said protective barrier consists essentially of Yttria.

76. The upper electrode assembly shield as recited in claim 66, wherein said protective barrier is provided on said first opening surface of said opening, and said mating surface excluding said fastening surface of said opening in said deposition shield.

77. The upper electrode assembly as recited in claim 35, wherein said protective barrier comprises at least one of $Al_2O_3$, $Y_2O_3$, $Sc_2O_3$, $Sc_2F_3$, $YF_3$, $La_2O_3$, $CeO_2$, $Eu_2O_3$, and $DyO_3$.

78. The upper electrode assembly as recited in claim 67, wherein:

said plenum surface includes an anozidation layer provided thereon, and said first surface other than said plenum surface does not include an anodization layer provided thereon and dos not include said protective barrier provided thereon.

* * * * *

UNITED STATES PATENT AND TRADEMARK OFFICE
CERTIFICATE OF CORRECTION

PATENT NO. : 7,147,749 B2  Page 1 of 1
APPLICATION NO. : 10/259858
DATED : December 12, 2006
INVENTOR(S) : Shinya Nishimoto et al.

It is certified that error appears in the above-identified patent and that said Letters Patent is hereby corrected as shown below:

Change in Column 9, line 47, "$DyO_3$" to --$Dy_2O_3$--.

Change in Column 12, line 67, "$DyO_3$" to --$Dy_2O_3$--.

Change in Column 15, line 4, "$DyO_3$" to --$Dy_2O_3$--.

Change in Column 18, line 49, "$DyO_3$" to --$Dy_2O_3$--.

Signed and Sealed this

Twentieth Day of November, 2007

JON W. DUDAS
*Director of the United States Patent and Trademark Office*